(12) United States Patent
Freund

(10) Patent No.: US 8,165,180 B2
(45) Date of Patent: Apr. 24, 2012

(54) WAVEGUIDE DEVICE HAVING DELTA DOPED ACTIVE REGION

(75) Inventor: Joseph Michael Freund, Fogelsville, PA (US)

(73) Assignee: Agere Systems, Inc., Allentown, PA (US)

( * ) Notice: Subject to any disclaimer, the term of this patent is extended or adjusted under 35 U.S.C. 154(b) by 351 days.

(21) Appl. No.: 12/307,186

(22) PCT Filed: Dec. 28, 2007

(86) PCT No.: PCT/US2007/089046
§ 371 (c)(1),
(2), (4) Date: Dec. 31, 2008

(87) PCT Pub. No.: WO2009/085050
PCT Pub. Date: Jul. 9, 2009

(65) Prior Publication Data
US 2010/0290497 A1 Nov. 18, 2010

(51) Int. Cl.
*H01S 5/00* (2006.01)

(52) U.S. Cl. ........................................ 372/50.1

(58) Field of Classification Search .................. 372/50.1
See application file for complete search history.

(56) References Cited

U.S. PATENT DOCUMENTS

| | | | |
|---|---|---|---|
| 4,980,892 A * | 12/1990 | Cunningham et al. ..... | 372/45.01 |
| 6,240,114 B1 * | 5/2001 | Anselm et al. ............. | 372/45.01 |
| 6,917,739 B2 * | 7/2005 | Chen .......................... | 385/122 |
| 2005/0002428 A1 * | 1/2005 | Kwak et al. ............... | 372/36 |

\* cited by examiner

*Primary Examiner* — Patrick Stafford

(57) ABSTRACT

Embodiments of the invention include a laser structure having a delta doped active region for improved carrier confinement. The laser structure includes an n-type cladding layer, an n-type waveguide layer formed adjacent the n-type cladding layer, an active region formed adjacent the n-type waveguide layer, a p-type waveguide layer formed adjacent the active region, and a p-type cladding layer formed adjacent the p-type waveguide layer. The laser structure is configured so that a p-type dopant concentration increases across the active region from the n-type side of the active region to the p-type side of the active region and/or an n-type dopant concentration decreases across the active region from the n-type side of the active region to the p-type side of the active region. The delta doped active region provides improved carrier confinement, while eliminating the need for blocking layers, thereby reducing stress on the active region caused thereby.

13 Claims, 6 Drawing Sheets

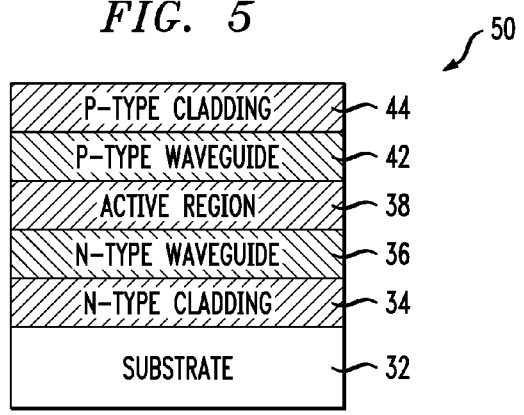
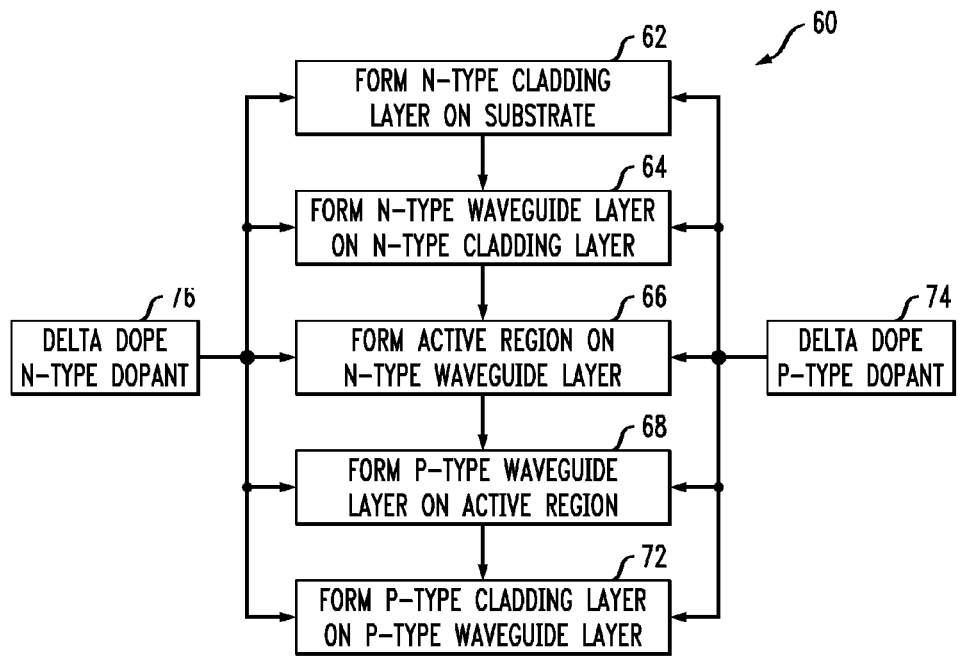

WAVEGUIDE DEVICE HAVING DELTA DOPED ACTIVE REGION

BACKGROUND OF THE INVENTION

1. Field of the Invention

The invention relates to waveguide devices, such as laser structures. More particularly, the invention relates to waveguide devices having improved suppression of carrier flow from the active region of the waveguide device.

2. Description of the Related Art

Waveguide devices, such as semiconductor lasers, are used widely as a light source in optical communication systems, consumer optical products, and for other applications as well. Many conventional semiconductor laser structures include an electron blocking layer and/or a hole blocking layer to suppress carrier flow from the active region of the laser structure. See, e.g., U.S. Pat. No. 5,448,585. Such semiconductor laser structures include gallium nitride (GaN) laser structures, which are used for Blu-ray optical recording applications. The use of a blocking layer, which typically is an aluminum-gallium-nitride (AlGaN) layer in GaN lasers, suppresses carrier flow from the active region of the laser, which reduces the threshold current, thus allowing for greater maximum output power.

Conventionally, a blocking layer is formed directly adjacent to the active region, e.g., between the active region and the n-type or p-type waveguide layer. However, the formation of such a blocking layer has been shown to cause excessive strain on the active region, and can even cause cracking of the active region, e.g., due to differences in the thermal expansion properties of the blocking layer and the active region. However, positioning the blocking layer away from the active region reduces suppression effectiveness.

Alternatively, efforts have been made to position or form a blocking layer within the n-type waveguide layer and/or the p-type waveguide layer. However, such efforts have shown limited success in reducing the strain on the active region. Also, alternatively, efforts have been made to suppress carrier flow by introducing different blocking layer materials into the n-type and/or p-type waveguide layers. Such efforts also have been met with limited success.

Accordingly, it would be desirable to have available a laser structure and corresponding method for eliminating blocking layers within the laser structure, thus reducing stress on the active region, while also improving carrier confinement within the active region compared to conventional laser structures that do not have blocking layers.

SUMMARY OF THE INVENTION

The invention is embodied in a laser structure having a delta doped active region. The laser structure is suitable for use in optical storage devices and systems, and for use in other applications. The laser structure includes an n-type cladding layer, an n-type waveguide layer formed adjacent to the n-type cladding layer, an active region formed adjacent to the n-type waveguide layer, a p-type waveguide layer formed adjacent to the active region, and a p-type cladding layer formed adjacent to the p-type waveguide layer. The laser structure is configured in such a way that either one or both of a p-type dopant concentration increases across the active region from the n-type side of the active region to the p-type side of the active region and an n-type dopant concentration decreases across the active region from the n-type side of the active region to the p-type side of the active region. When the laser structure is delta doped with both the p-type and n-type dopants, the doping concentration typically forms a cross profile within the active region. Alternatively, the delta doping can extend beyond the active region into one or both waveguide regions and one or both cladding regions. Also, alternatively, the delta doping can extend beyond the active region and the waveguide regions, e.g., into one or both cladding regions. The delta doped active region eliminates the need for one or more blocking layers, thereby reducing stress on the active region often caused by such blocking layers. The delta doped active region also provides improved carrier confinement that conventionally is provided by such blocking layers.

BRIEF DESCRIPTION OF THE DRAWINGS

FIG. 5 is a sectional perspective view of a portion of a laser structure, according to an embodiment of the invention, including a delta doped active region, waveguide layers and cladding layers;

FIG. 6 is a block diagram of a method for improving carrier confinement within the active region of a semiconductor laser structure;

DETAILED DESCRIPTION OF EXEMPLARY EMBODIMENTS

Figure 1:
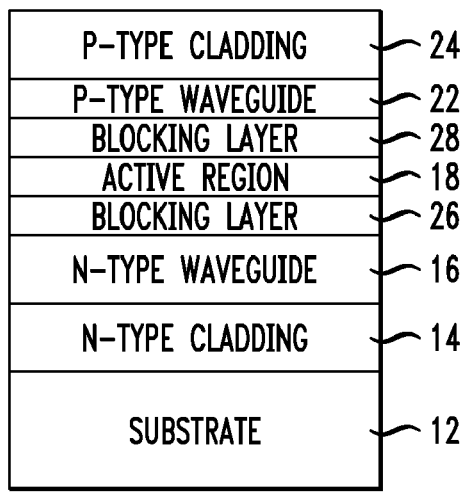
FIG. 1 is a sectional perspective view of a portion of a conventional laser structure including blocking layers on either side of the active region.

In the following description, like reference numerals indicate like components to enhance the understanding of the invention through the description of the drawings. Also, although specific features, configurations and arrangements are discussed hereinbelow, it should be understood that such is done for illustrative purposes only. A person skilled in the relevant art will recognize that other steps, configurations and arrangements are useful without departing from the spirit and scope of the invention.

Referring now to FIG. 1, shown is a sectional perspective view of a conventional laser structure 10, such as a gallium nitride (GaN) laser structure. Laser structures of this kind are used in various applications, including optical communications applications and in optical storage devices. The laser structure 10 is formed on a substrate 12, such as a sapphire, silicon carbide (SiC) or n-type gallium arsenide (GaAs) substrate. Formed on the substrate 12 is an n-type cladding layer 14, an n-type waveguide layer 16, an active layer or region 18, a p-type waveguide layer 22, and a p-type cladding layer 24. Alternatively, an additional buffer layer (not shown) can be formed between the substrate and the n-type cladding layer 14. As discussed previously hereinabove, many conventional laser structures also may include one or more blocking or stopper layers on either side of the active region 18, such as a first blocking or stopper layer 26 between the active region 18 and the n-type waveguide layer 16 and/or a second blocking or stopper layer 28 between the active region 18 and the p-type waveguide layer 22.

For a GaN laser structure, the n-type cladding layer 14 can be made of n-type aluminum gallium nitride (AlGaN) or other suitable material, and the p-type cladding layer 24 can be made of p-type AlGaN or other suitable material. Each of the cladding layers typically is approximately 1-2 microns (μm) thick. Also, for a GaN laser structure, the n-type waveguide layer 16 can be made of n-type GaN or other suitable material, and the p-type waveguide layer 22 can be made of p-type GaN or other suitable material. Each of the waveguide layers typically is approximately 2 microns (μm) thick, although some waveguide layers can be as thin as 0.2 microns (200 nanometers) in thickness. The active region 18 is made of GaN or other suitable material, and can be approximately 10-50 nanometers (nm) thick, depending on whether the active region includes one or more barrier layers (not shown).

The first and second blocking layers 26, 28 are made of AlGaN or other suitable material. Each of the blocking layers typically are approximately 10-20 nanometers (nm) thick. As discussed hereinabove, the one or more blocking layers suppress carrier flow from the active region 18, which generally improves the performance characteristics of the laser structure. However, due to differences in the thermal expansion properties of the blocking layer compared to other layers or regions, particularly the active region, the formation of a blocking layer adjacent to either the n-type side or the p-type side of the active region has been shown to cause excessive strain on the active region, and can even crack the active region.

Figure 2:
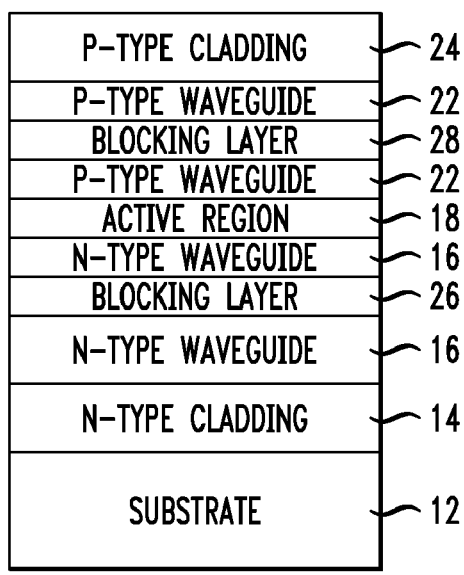
FIG. 2 is a sectional perspective view of a portion of another conventional laser structure including blocking layers formed within the waveguide layers.

Referring now to FIG. 2, shown is a sectional perspective view of another conventional laser structure 20, such as a GaN laser structure. The laser structure 20 is similar to the laser structure 10 shown in FIG. 1, except that the first blocking layer 26 is formed within the n-type waveguide layer 16, rather than between the n-type waveguide layer 16 and the active region 18, and/or the second blocking layer 28 is formed within the p-type waveguide layer 22, rather than between the active region 18 and the p-type waveguide layer 22. Although the one or more blocking layers are not formed directly adjacent to the active region 18, the thermal expansion properties of the blocking layers still manage to cause excessive strain on the active region 18.

Figure 3:
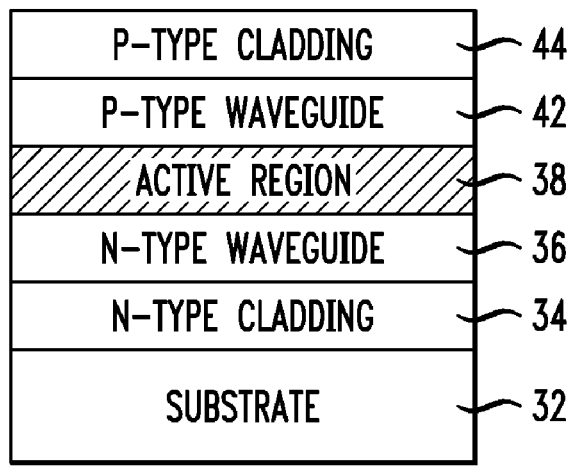
FIG. 3 is a sectional perspective view of a portion of a laser structure, according to an embodiment of the invention, including a delta doped active region.

Referring now to FIG. 3, shown is a sectional perspective view of a portion of a laser structure 30, e.g., a GaN laser structure, according to an embodiment of the invention. As will be discussed in greater detail hereinbelow, the laser structure 30 includes a delta doped active region for inhibiting carrier flow out of the active region. The laser structure 30 does not include any blocking or stopper layers. The laser structure 30 includes a substrate 32, such as an n-type gallium arsenide (GaAs) substrate. The laser structure 30 also includes an n-type cladding layer 34 formed on or adjacent to the substrate, and an n-type waveguide layer 36 formed on or adjacent to the n-type cladding layer 34. The n-type cladding layer 34 can be made of n-type AlGaN or other suitable material. The n-type waveguide layer 36 can be made of n-type GaN or other suitable material.

The laser structure 30 also includes an active layer or region 38 formed on or adjacent to the n-type waveguide layer 36. The active region 38 can be made of InGaN or other suitable material, and is delta doped, as will be discussed in greater detail hereinbelow. The laser structure 30 also includes a p-type waveguide layer 42 formed on or adjacent to the active region 38. The p-type waveguide layer 42 can be made of p-type GaN or other suitable material. The laser structure 30 also includes a p-type cladding layer 44 formed on or adjacent to the p-type waveguide layer 42. The p-type cladding layer 44 cam be made of p-type AlGaN or other suitable material.

According to embodiments of the invention, the active region 38 of the laser structure 30 is delta doped with at least one dopant in such a way that the dopant concentration gradually changes across the active region 38, i.e., from a maximum dopant concentration at the interface between the active region 38 and one of the waveguide layers to a minimum dopant concentration (e.g., essentially zero) at the interface between the active region 38 and the other waveguide layer. The delta doping is shown generally as shading in the active region 38.

For example, the active region 38 can be doped with a p-type dopant, such as magnesium (Mg), in such a way that the p-type dopant concentration gradually increases from a minimum dopant concentration at the interface between the active region 38 and the n-type waveguide layer 36 to a maximum dopant concentration at the interface between the active region 38 and the p-type waveguide layer 42. Such p-type delta doping provides improved electron confinement within the active region 38. The delta doping can be such that the dopant concentration increases across the active region 38 is any suitable manner, e.g., an approximately linear dopant concentration increase across the active region 38. For example, during the growth cycle of the active region 38, e.g., using metal-organic chemical vapor deposition (MOCVD), molecular-beam epitaxy (MBE) or other suitable region growth technique, the doping concentration of the p-type dopant is adjusted accordingly so that the doping concentration increases gradually, e.g., approximately linearly, as the active region 38 is being formed.

In addition to or instead of the p-type delta doping just described, the active region 38 can be delta doped with an n-type dopant across the active region 38 for improved hole confinement in the active region 38. The n-type delta doping concentration typically is reversed from or opposite to that of the p-type dopant concentration across the active region 38, e.g., to form a crossing profile of the dopants. That is, the active region 38 can be doped with an n-type dopant, such as silicon (Si), in such a way that the dopant concentration gradually decreases from a maximum dopant concentration at the interface between the active region 38 and the n-type waveguide layer 36 to a minimum dopant concentration (e.g., essentially zero) at the interface between of the active region 38 and the p-type waveguide layer 42. The n-type delta doping can be such that the dopant concentration increases approximately linearly across the active region 38, or in some other suitable gradual manner. The n-type delta doping can be accomplished by appropriately adjusting the concentration of the n-type dopant (e.g., Si) as the active region 38 is being formed.

According to alternative embodiments of the invention, a portion of the active region 38, e.g., a portion adjacent to each of the waveguide layers, can remain undoped (e.g., GaN) to further enhance carrier flow confinement within the active region 38. In such embodiment, the delta doping does not extend completely across the active region 38, i.e., the delta doping does not extend from the interface between the active region 38 and one of the waveguide layers to the interface between the active region 38 and the other waveguide layer.

Figure 4:
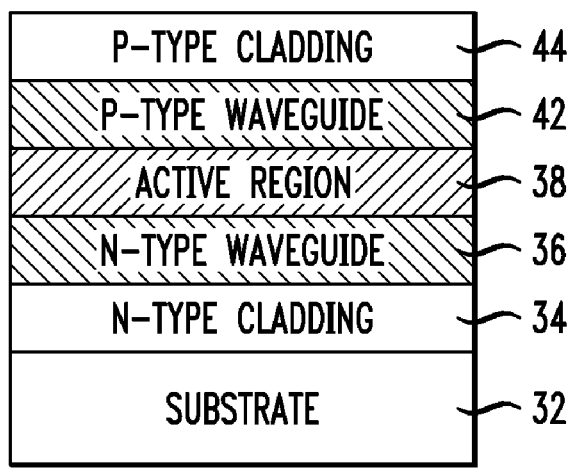
FIG. 4 is a sectional perspective view of a portion of a laser structure, according to an embodiment of the invention, including a delta doped active region and waveguide layers.

According to alternative embodiments of the invention, the n-type delta doping and/or the p-type delta doping can extend beyond the active region 38 into at least a portion of one or both of the waveguide regions, i.e., the n-type waveguide layer 36 and/or the p-type waveguide layer 42. Referring now to FIG. 4, shown is a sectional perspective view of a portion of a laser structure 40 according to an alternative embodiment of the invention, e.g., in which the delta doping across the active region 38 extends into at least a portion of one or both of the waveguide layers. In general, the n-type cladding layer 34, the n-type waveguide layer 36, the active region 38, the p-type waveguide layer 42 and the p-type cladding layer 44 are similar to those corresponding layers or regions in the laser structure 30 of FIG. 3. However, in the laser structure 40 of FIG. 4, delta doping extends beyond the active region 38 to the n-type waveguide layer 36 and the p-type waveguide layer 42. The delta doping is shown generally as shading in the active region 38, the n-type waveguide layer 36 and the p-type waveguide layer 42.

For example, during the growth cycle of the n-type waveguide layer 36, the doping concentration of a p-type dopant is adjusted accordingly so that the doping concentration increases gradually from a minimum concentration. The concentration of the p-type dopant continues to increase during the formation of the active region 38 to a maximum concentration during the formation of the p-type waveguide layer 42. It should be understood that, in this particular embodiment of the invention, the p-type delta doping can begin at any time during the formation of the n-type waveguide layer 36, and thus the minimum concentration of the p-type dopant can occur anywhere within the n-type waveguide layer 36, not just at the interface between the n-type cladding layer 34 and the n-type waveguide layer 36, although such is possible. Similarly, it should be understood that, in this particular embodiment of the invention, the p-type delta doping can end at any time during the formation of the p-type waveguide layer 42, thus the maximum concentration of the p-type dopant can occur anywhere within the p-type waveguide layer 42, and not at the interface between the p-type waveguide layer 42 and the p-type cladding layer 44, although such also is possible. Also, alternatively, the delta doping does not have to begin and end within one of the waveguide layers, i.e., delta doping can extend beyond the active region into only one of the waveguide layers.

In addition to or instead of delta doping the active region 38 and at least a portion of the n-type waveguide layer 36 and/or the p-type waveguide layer 42 with a p-type dopant, delta doping can occur across such regions and/or layers using an n-type dopant. For example, during the growth cycle of the n-type waveguide layer 36, the doping concentration of an n-type dopant can be adjusted accordingly so that the doping concentration decreases gradually from a maximum concentration, and continues to decrease during the formation of the active region 38 to a minimum concentration during the formation of the p-type waveguide layer 42. As with the p-type delta doping, the n-type delta doping can begin at any time during the formation of the n-type waveguide layer 36 and end at any time during the formation of the p-type waveguide layer 42. Alternatively, n-type delta doping can extend beyond the active region 38 into only one of the waveguide layers.

According to other alternative embodiments of the invention, the p-type delta doping and/or the n-type delta doping can extend beyond the active region 38 and one or both waveguide layers into one or both cladding layers, i.e., the n-type cladding layer 34 and/or the p-type cladding layer 44. Referring now to FIG. 5, shown is a sectional perspective view of a laser structure 50 according to an another alternative embodiment of the invention, e.g., in which the delta doping across the active region 38 and the waveguide layers extends into at least a portion of one or both of the cladding layers. In general, the n-type cladding layer 34, the n-type waveguide layer 36, the active region 38, the p-type waveguide layer 42 and the p-type cladding layer 44 are similar to those corresponding layers or regions in the laser structure 30 of FIG. 3 and the laser structure 40 of FIG. 4. However, in the laser structure 50 of FIG. 5, delta doping extends beyond the active region 38 and the waveguide layers 36, 42 into at least a portion of one or both of the n-type cladding layer 34 and the p-type cladding layer 44. The delta doping is shown generally as shading in the active region 38, the n-type waveguide layer 36, the p-type waveguide layer 42, the n-type cladding layer 34 and the p-type cladding layer 44.

For example, during the growth cycle of the n-type cladding layer 34, the doping concentration of a p-type dopant is adjusted accordingly so that the doping concentration increases gradually from a minimum concentration. The concentration of the p-type dopant continues to increase during the formation of the n-type waveguide layer 36, the active region 38 and the p-type waveguide layer 42 to a maximum concentration during the formation of the p-type cladding layer 44. It should be understood that, in this particular embodiment of the invention, the p-type delta doping can begin at any time during the formation of the n-type cladding layer 34, and thus the minimum concentration of the p-type dopant can occur anywhere within the n-type cladding layer 34, not just at the interface between the substrate 32 and the n-type cladding layer 34, although such is possible. Similarly, it should be understood that, in this particular embodiment of the invention, the p-type delta doping can end at any time during the formation of the p-type cladding layer 44, thus the maximum concentration of the p-type dopant can occur anywhere within the p-type cladding layer 44, and not necessarily at the top surface of the p-type cladding layer 44, although such also is possible. Also, alternatively, the delta doping does not have to begin and end within one of the cladding layers, i.e., delta doping can extend beyond the active region and the waveguide layers into only one of the cladding layers.

Also, in addition to or instead of delta doping the active region 38, the waveguide layers 36, 42 and at least a portion of the n-type cladding layer 34 and/or the p-type cladding layer 44 with a p-type dopant, delta doping can occur across such regions and/or layers using an n-type dopant. For example, during the growth cycle of the n-type cladding layer 34, the doping concentration of an n-type dopant can be adjusted accordingly so that the doping concentration decreases gradually from a maximum concentration, and continues to decrease during the formation of the n-type waveguide layer 36, the active region 38 and the p-type waveguide layer 42 to a minimum concentration during the formation of the p-type cladding layer 44. As with the p-type delta doping, the n-type delta doping can begin at any time during the formation of the n-type cladding layer 34 and end at any time during the formation of the p-type cladding layer 44. Alternatively, n-type delta doping can extend beyond the active region 38 and one or both waveguide layers into only one of the corresponding cladding layers.

Laser structures according to embodiments of the invention eliminate the need for one or more blocking or stopper layers, while still providing electron and/or hole confinement within the active region of the laser. The elimination of the blocking or stopper layers reduces stress on the active region caused by such blocking layers. The elimination of the blocking or stopper layers also reduces the number of layer growth cycles required in manufacturing the laser structure, thus improving the growth morphology, improving manufacturability, and reducing manufacturing cost.

Referring now to FIG. 6, shown is a block diagram 60 of a method for improving carrier confinement within the active region of a waveguide device, such as a semiconductor laser structure. The method 60 includes a step 62 of forming the n-type cladding layer 34 on or adjacent to the substrate 32. As discussed previously hereinabove, for GaN laser structures, the substrate 32 typically is an n-type sapphire or GaAs substrate and the n-type cladding layer 34 typically is an n-type AlGaN cladding layer. The n-type cladding layer 34 typically is formed to a thickness within the range of approximately 1-2 µm. As with other layer and region forming steps, described hereinbelow, the step 62 of forming the n-type cladding layer 34 can be performed by any suitable means, e.g., by MOCVD or MBE.

The method 60 also includes a step 64 of forming the n-type waveguide layer 36 on or adjacent to the n-type cladding layer 34. For GaN laser structures, the n-type waveguide layer 36 typically is an n-type GaN layer. The n-type waveguide layer 36 typically is formed to a thickness within the range of approximately 0.2-2.0 µm.

The method 60 also includes a step 66 of forming the active region 38 on or adjacent to the n-type waveguide layer 36. For GaN laser structures, the active region 38 typically is made of GaN or other suitable material. The active region 38 typically is formed to a thickness within the range of approximately 10-50 nm.

The method 60 also includes a step 68 of forming the p-type waveguide layer 42 on or adjacent to the active region 38. For GaN laser structures, the p-type waveguide layer 42 typically is a p-type GaN layer. Also, the p-type waveguide layer 42 typically is formed to a thickness within the range of approximately 0.2-2.0 µm.

The method 60 also includes a step 72 of forming the p-type cladding layer 44 on or adjacent to the p-type waveguide layer 42. For GaN laser structures, the p-type cladding layer 44 typically is a p-type AlGaN layer. The p-type cladding layer 44 typically is formed to a thickness within the range of approximately 1-2 µm.

The method also includes one or more delta doping steps, e.g., a p-type dopant delta doping step 74 and/or an n-type dopant delta doping step 76. As shown, and as described hereinabove, either one or both of the p-type dopant delta doping step 74 and the n-type dopant delta doping step 76 can be performed during any one of the layer or region formation steps 62-72.

As discussed hereinabove, the active region 38 can be delta doped with a p-type dopant in such a manner that the concentration of the p-type dopant gradually increases across the active region 38, e.g., from the interface between the active region 38 and the n-type waveguide layer 36 to the interface between the active region and the p-type waveguide layer 42. Also, the active region 38 can be delta doped with an n-type dopant in such a manner that the concentration of the n-type dopant gradually decreases across the active region 38, e.g., from the interface between the active region 38 and the n-type waveguide layer 36 to the interface between the active region and the p-type waveguide layer 42. As discussed hereinabove, either one or both of the p-type dopant delta doping and the n-type dopant delta doping can be performed on all or a portion of the active region 38, thus the p-type dopant delta doping step 74 and/or the n-type dopant delta doping step 76 can be performed during all or part of the active region formation step 38.

Alternatively, as shown, either one or both of the p-type dopant delta doping step 74 and the n-type dopant delta doping step 76 can be performed in such a manner that the respective p-type and/or n-type dopant delta doping extends completely across and beyond the active region 38, e.g., into at least a portion of one or more of the waveguide layers. Also, alternatively, as shown, either one or both of the p-type dopant delta doping step 74 and the n-type dopant delta doping step 76 can be performed in such a manner that the respective p-type and/or n-type dopant delta doping extends completely across and beyond the active region 38 and the waveguide layers, e.g., into at least a portion of one or more of the cladding layers.

Figure 7:
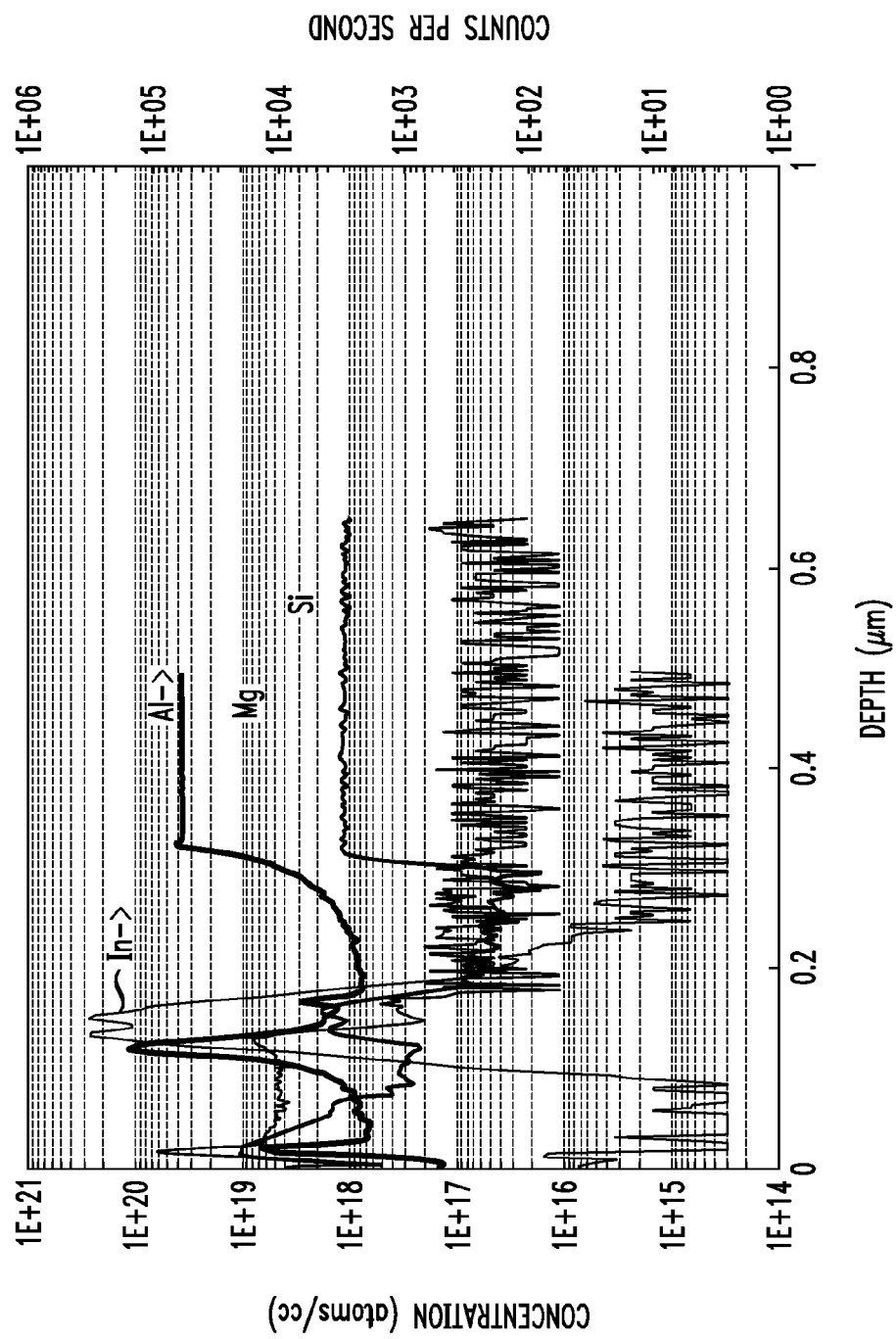
FIG. 7 is a graphical view of doping concentrations for a conventional gallium nitride (GaN) laser structure having an aluminum-gallium-nitride (AlGaN) blocking layer.

Referring now to FIG. 7, shown is a graphical view of doping concentrations for a conventional gallium nitride (GaN) laser structure having an aluminum-gallium-nitride (AlGaN) blocking layer. The graph generally shows the material concentrations for indium (In), aluminum (Al), magnesium (Mg) and silicon (Si), as a function of layer formation depth, in microns (µm). As discussed hereinabove, indium is used for the active region, thus the concentration of indium is increased during the formation of the active region. Magnesium is used for p-type layers, such as the p-type cladding layer and the p-type waveguide layer. Silicon is used for n-type layers, such as the n-type cladding layer and the n-type waveguide layer. Aluminum is used for the one or more AlGaN blocking or stopper layers, e.g., adjacent to either side of the active region and/or in other locations throughout the laser structure.

Figure 8:
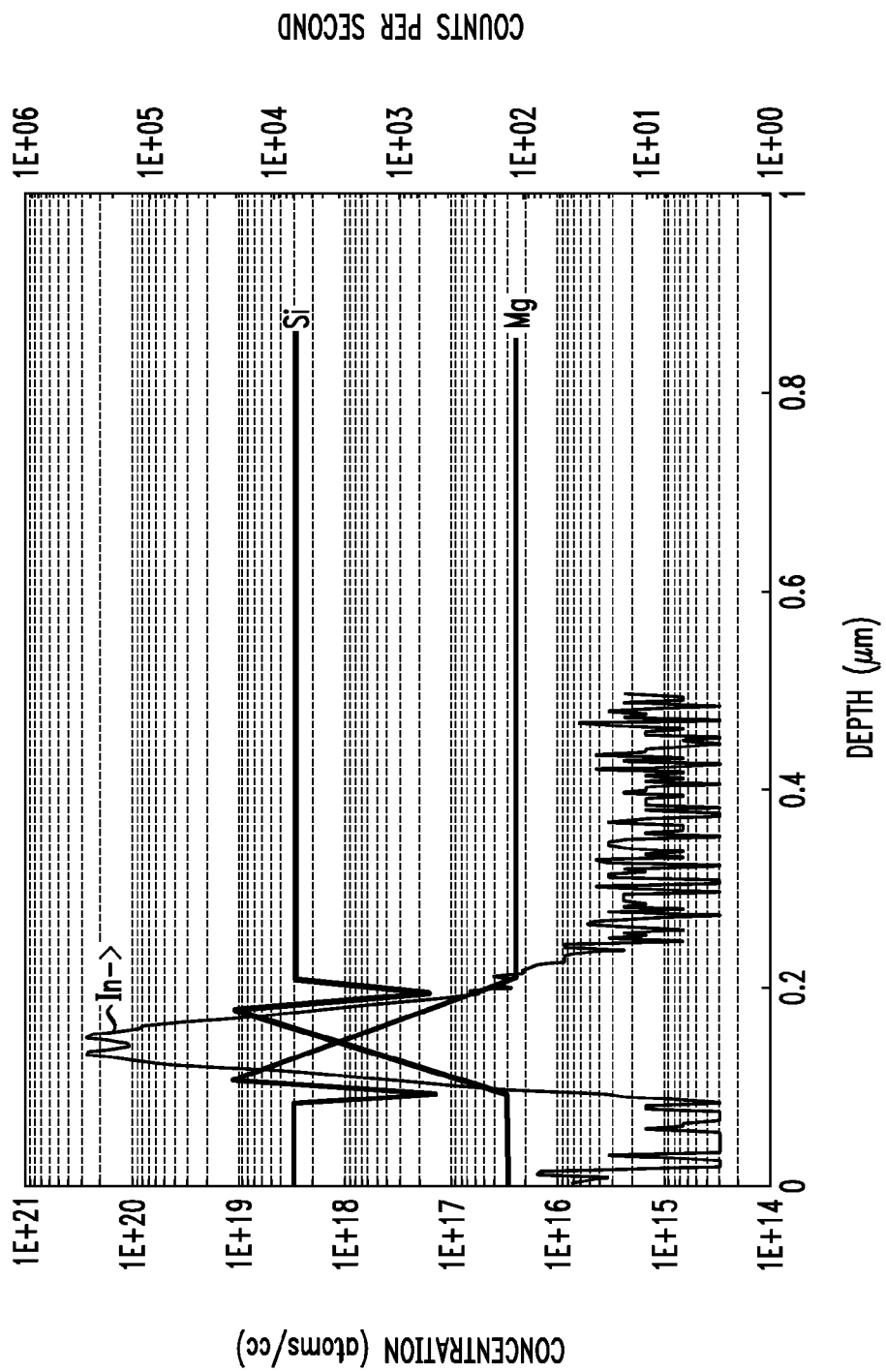
FIG. 8 is a graphical view of doping concentrations for a GaN laser structure according to embodiments of the invention.

Referring now to FIG. 8, shown is a graphical view of doping concentrations for a GaN laser structure according to embodiments of the invention. The graph generally shows the material concentrations for indium (In), silicon (Si) and magnesium (Mg). Since there are no blocking layers, no material concentration for aluminum is shown. As discussed, indium is used for the active region, thus the concentration for indium is increased during the formation of the active region, as shown.

Magnesium is used for p-type layers, such as the p-type cladding layer and the p-type waveguide layer. Also, according to embodiments of the invention, magnesium also can be used to delta dope the active region with a p-type dopant. As shown in the graph, during the formation of the p-type waveguide layer, the magnesium concentration is relatively large, e.g., approximately $3.0 \times 10^{18}$ atoms per cubic centimeter (atoms/cc). Then, as the formation of the active region begins (e.g., when the indium concentration increases greatly), following a brief (undoped) period where the magnesium concentration spikes downward to approximately $1.5 \times 10^{17}$ atoms/cc, the magnesium concentration is increased to a maximum concentration, e.g., to approximately $1.0 \times 10^{19}$ atoms/cc. During the formation of the remainder of the active region, the magnesium concentration gradually decreases to a minimum thereafter, e.g., to approximately $2.5 \times 10^{16}$ atoms/cc. Thereafter, the magnesium concentration remains relatively small, e.g., during the formation of the p-type waveguide layer.

Silicon is used for n-type layers, such as the n-type cladding layer and the n-type waveguide layer. Also, according to embodiments of the invention, silicon can be used to delta dope the active region with n-type dopant. As shown in the graph, during the formation of the p-type waveguide layer, the silicon concentration is relatively small (e.g., approximately $3.0 \times 10^{16}$ atoms/cc), then gradually increases during the formation of the active region to a maximum concentration of approximately $1.0 \times 10^{19}$ atoms/cc at the interface between the active region and the n-type waveguide layer. Thereafter, following a brief (undoped) period where the silicon concentration spikes downward to approximately $1.5 \times 10^{17}$ atoms/cc, the silicon concentration is increased to approximately $3.0 \times 10^{18}$ atoms/cc) during the formation of the n-type waveguide layer.

As shown, in the manner described previously hereinabove, the delta doping concentrations of the p-type dopant (magnesium) and the n-type dopant (silicon) form a cross profile through the active region.

Figure 9:
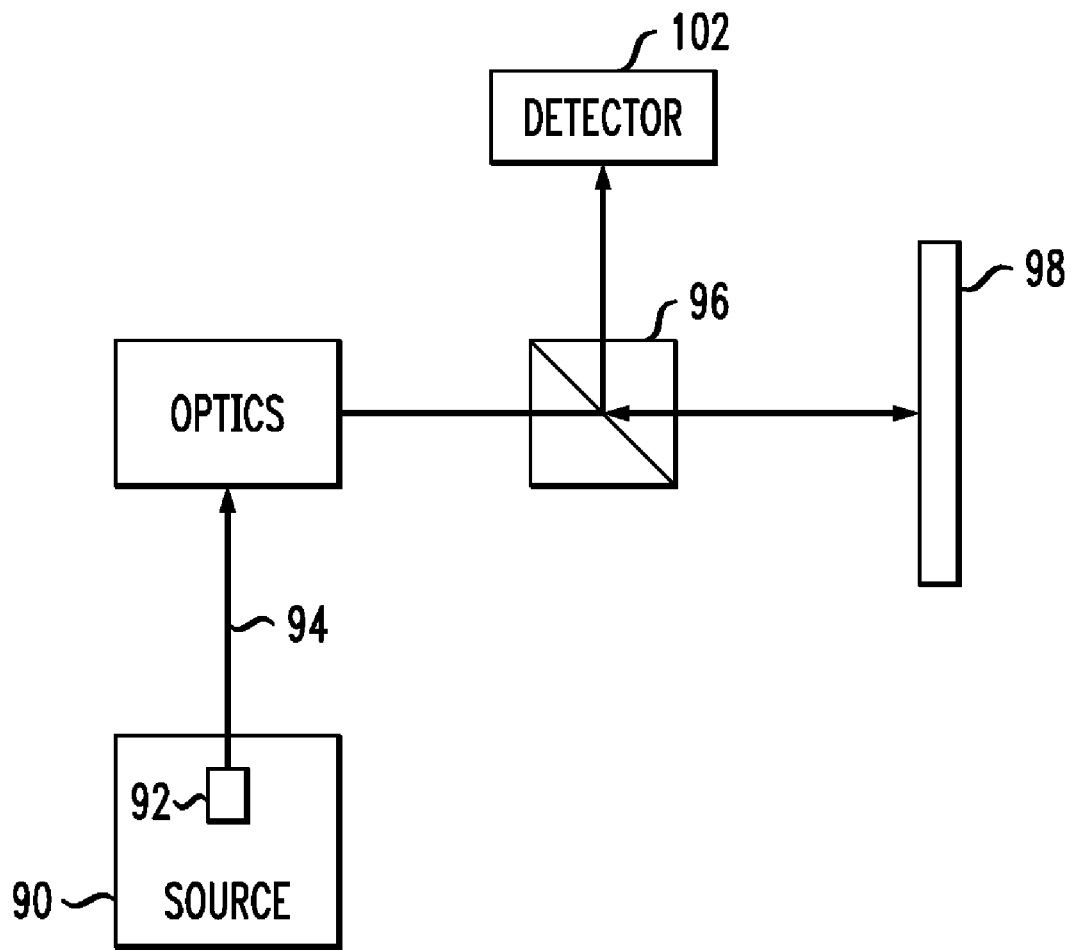
FIG. 9 is a perspective view of an optical storage device according to embodiments of the invention.

Referring now to FIG. 9, shown is a perspective view of an optical storage device 90 according to embodiments of the invention. The device 90 includes a light source 91 that includes a semiconductor laser 92, such as one of the inventive semiconductor lasers discussed hereinabove, for producing a laser beam 94. The device 90 also includes appropriate optics (shown generally as 96), such as one or more collimating lenses and mirrors for focusing and directing the laser beam 94 toward a beam splitter 96 and then to an optical storage media 98, such as an optical storage disc. The device 90 also can include one or more additional lenses (not shown) between the beam splitter 96 and the optical storage media 98 for focusing the light upon a particular portion of the optical storage media 98.

Light reflected back from the optical storage media 98 is directed by the beam splitter 96 to an optical detector 102. The optical detector 102 can be any suitable detector, such as one that includes one or more photodiode or photo-transistors, for converting optical information into digital information. The output of the optical detector 102 represents a digital data stream that varies according to the optical characteristics of portions of the optical storage media 98 from which the detected light was reflected.

It will be apparent to those skilled in the art that many changes and substitutions can be made to the embodiments of the invention herein described without departing from the spirit and scope of the invention as defined by the appended claims and their full scope of equivalents.

The invention claimed is:

1. A semiconductor laser device, comprising:
   an n-type cladding layer;
   an n-type waveguide layer formed adjacent to the n-type cladding layer;
   an active region formed adjacent to the n-type waveguide layer;
   a p-type waveguide layer formed adjacent to the active region; and
   a p-type cladding layer formed adjacent to the p-type waveguide layer, wherein the device is delta doped in such a way that at least one of a p-type dopant concentration across at least the entire active region increases from a first concentration to a second concentration wherein the second concentration is greater than the first concentration, and an n-type dopant concentration across at least the entire active region decreases from a third concentration to a fourth concentration wherein the third concentration is greater than the fourth concentration.

2. The device as recited in claim 1, wherein the first position is an interface between the active region and the n-type waveguide layer and the second position is an interface between the active region and the p-type waveguide layer, and wherein the third position is the interface between the active region and the n-type waveguide layer and the fourth position is the interface between the active region and the p-type waveguide layer.

3. The device as recited in claim 1, wherein the device is doped in such a way that at least one of a p-type dopant concentration increases from a minimum concentration in at least a portion of one of the n-type cladding layer and the n-type waveguide layer, across the active region to a maximum concentration in at least a portion of one of the p-type waveguide layer and the p-type cladding layer, and an n-type dopant concentration decreases from a maximum concentration in at least a portion of one of the n-type cladding layer and the n-type waveguide layer, across the active region to a minimum concentration in at least a portion of one of the p-type waveguide layer and the p-type cladding layer.

4. The device as recited in claim 1, wherein the first position is within the n-type waveguide layer and the second position is within the p-type waveguide layer, and wherein the third position is within the n-type waveguide layer and the fourth position is within the p-type waveguide layer.

5. The device as recited in claim 1, wherein the first position is within the n-type cladding layer and the second position is within the p-type cladding layer, and wherein the third position is within the n-type cladding layer and the fourth position is within the p-type cladding layer.

6. The device as recited in claim 1, wherein the active region includes at least one of an undoped portion at the interface between the active region and the n-type waveguide layer and an undoped portion at the interface between the active region and the p-type waveguide layer, wherein the undoped portion does not include p-type dopant or n-type dopant.

7. The device as recited in claim 1, wherein the p-type dopant concentration has a maximum concentration within the range from approximately $3.0 \times 10^{18}$ to approximately $1.5 \times 10^{19}$ atoms per cubic centimeter (atoms/cc) at the first position.

8. The device as recited in claim 1, wherein the n-type dopant concentration has a maximum concentration with the range of approximately $3.0 \times 10^{18}$ to approximately $1.5 \times 10^{19}$ atoms per cubic centimeter (atoms/cc) at the third position.

9. The device as recited in claim 1, wherein the p-type dopant includes magnesium (Mg).

10. The device as recited in claim 1, wherein the n-type dopant includes silicon (Si).

11. The device as recited in claim 1, wherein the active region is indium gallium nitride (InGaN), the p-type waveguide layer and the n-type waveguide layer are gallium nitride (GaN), and the p-type cladding layer and the n-type cladding layer are aluminum gallium nitride (AlGaN).

12. An optical storage device, comprising:
    a semiconductor laser light source configured to direct laser light toward an optical storage medium, wherein the semiconductor laser light source includes
    an n-type cladding layer,
    an n-type waveguide layer formed adjacent to the n-type cladding layer,
    an active region formed adjacent to the n-type waveguide layer,
    a p-type waveguide layer formed adjacent to the active region, and
    a p-type cladding layer formed adjacent to the p-type waveguide layer,
    wherein the semiconductor laser light source is delta doped in such a way that at least one of a p-type dopant concentration across at least the entire active region increases from a first concentration to a second concentration wherein the second concentration is greater than the first concentration, and an n-type dopant concentration across at least the entire active region decreases from a third concentration to a fourth concentration wherein the third concentration is greater than the fourth concentration; and a light receiver configured to receive light reflected off of the optical storage medium, wherein the light reflected off of the optical storage medium is indicative of information stored on the optical storage medium.

13. The device as recited in claim 12, wherein the semiconductor laser light source is doped in such a way that at least one of a p-type dopant concentration increases from a minimum concentration in at least a portion of one of the n-type cladding layer and the n-type waveguide layer, across the active region to a maximum concentration in at least a portion of one of the p-type waveguide layer and the p-type cladding layer, and an n-type dopant concentration decreases from a maximum concentration in at least a portion of one of the n-type cladding layer and the n-type waveguide layer, across the active region to a minimum concentration in at least a portion of one of the p-type waveguide layer and the p-type cladding layer.

* * * * *